United States Patent
Inaba (10) Patent No.: US 6,844,247 B2
(45) Date of Patent: Jan. 18, 2005

(54) SEMICONDUCTOR DEVICE AND METHOD OF MANUFACTURING THE SAME

(75) Inventor: Satoshi Inaba, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/368,573

(22) Filed: Feb. 20, 2003

(65) Prior Publication Data

US 2003/0148572 A1 Aug. 7, 2003

Related U.S. Application Data

(63) Continuation of application No. 10/066,719, filed on Feb. 6, 2002, now Pat. No. 6,541,357.

(30) Foreign Application Priority Data

Dec. 4, 2001 (JP) ........................................ 2001-370313

(51) Int. Cl.[7] ........................... H01L 21/20; H01L 21/36
(52) U.S. Cl. ........................ 438/482; 438/197; 257/296
(58) Field of Search ................................. 438/197, 258, 438/482, 488; 257/296, 346, 391, 900

(56) References Cited

U.S. PATENT DOCUMENTS

| 5,101,247 | A | | 3/1992 | Ozturk et al. |
| 5,514,611 | A | * | 5/1996 | Kim et al. ................... 438/275 |
| 6,180,499 | B1 | | 1/2001 | Yu |
| 6,333,223 | B1 | | 12/2001 | Moriwaki et al. |
| 6,555,879 | B1 | * | 4/2003 | Krivokapic et al. ......... 257/382 |

* cited by examiner

*Primary Examiner*—Phuc T. Dang
(74) *Attorney, Agent, or Firm*—Oblon, Spivak, McClelland, Maier & Neustadt, P.C.

(57) ABSTRACT

A semiconductor device Having: a semiconductor substrate; a first gate electrode constructed of a multi-layered stack member provided in a memory region, formed with memory cells, so that the first gate electrode is insulated by a first insulating layer from the semiconductor substrate; and a second gate electrode provided in a logic region, formed with a logic circuit for controlling at least the memory cells, so that the second gate electrode is insulated by a second insulating layer from a semiconductor substrate, wherein said layer, brought into contact with the first insulating layer, of the first gate electrode and the layer, brought into contact with the second insulating layer, of the second gate electrode, are composed of materials different from each other, and a method for making the same.

14 Claims, 9 Drawing Sheets

SEMICONDUCTOR DEVICE AND METHOD OF MANUFACTURING THE SAME

CROSS REFERENCE TO RELATED APPLICATIONS

This application is based upon and claims the benefit of priority from the prior Japanese Patent Application No. 2001-370313, filed on Dec. 4, 2001; the entire contents of which are incorporated herein by reference.

BACKGROUND OF THE INVENTION

The present invention relates generally to a semiconductor device and a method for manufacturing the semiconductor device, and more particularly to a DRAM embedded with a logic circuit and a DRAM and a manufacturing method thereof.

It has been demanded to speed-up of operation of a system LSI. Responding to this demand, a plurality of types of devices having functions different from each other are mounted on a single semiconductor substrate. One example thereof is the system LSI including a logic circuit for controlling the DRAM, wherein the logic circuit and the DRAM are embedded into one single chip. Thus, the system LSI embedded with the logic circuit and the DRAM is referred to as an embedded DRAM (which will hereinafter simply abbreviated to eDRAM).

The eDRAM is constructed of a memory region where a memory array of the DRAM is provided, and a logic region to provide the logic circuit for controlling an operation of the memory and performing arithmetic operations.

A field effect transistor (FET) used for the memory device (which will hereinafter be called the memory device FET) is different in terms of its function from an FET used for the logic device (which will hereinafter be called the logic device FET). Accordingly, these two types of FETs are structured differently. Generally, separate manufacturing processes are required for providing the plurality of device FETs having the structures different from each other on the single semiconductor substrate.

On the other hand, if scheming to simplify the manufacturing processes by making common the processes for manufacturing the plurality of device FETs having the structures different from each other, it is difficult to obtain functions and performances demanded of the respective FETs.

It is therefore difficult to obtain a reliability of a gate insulating layer of the memory device FET, attain a speed-up of the logic device FET and reduce a manufacturing cycle time at the same time. Namely, there is a trade-off relationship between the enhancement of the function and performance of the eDRAM and the reduction and simplification of the manufacturing processes.

Thus, conventionally, there must be a compromise either on the side of enhancing the function and performance of the system LSI or on the side of reducing and simplifying the manufacturing processes.

The speed-up of the logic device FET of the eDRAM has been attained over the recent years by making its size hyperfine and decreasing a thickness of the gate insulating layer. The decrease in the thickness of the gate insulating layer leads to an increase in electric field applied to the gate electrode. A depletion layer is thereby formed in the gate electrode. This depletion layer exerts substantially the same influence as increasing the thickness of the gate insulating layer upon the logic device FET. Namely, a capacitance $C_{OX}$ between the gate electrode and the semiconductor substrate decreases. With the decrease in the capacitance $C_{OX}$, a threshold value of the logic device FET substantially rises, while an electric current flowing to the logic device FET decreases. Namely, a current drive capability of the logic device FET declines.

Particularly, the P-type FET receives a larger influence of the depletion layer in the gate electrode than the N-type FET. It is because boron in the P-type gate electrode is harder to activate than phosphorus or arsenic in the N-type gate electrode.

Such being the case, polycrystalline silicon germanium (which will hereinafter be abbreviated to poly-SiGe) replacing polycrystalline silicon is used as the gate electrode in order to further activate boron in the P-type FET.

The manufacturing processes of such system LSI can be reduced by using poly-SiGe also for the gate electrode of the memory device FET in the memory array. Germanium contained in poly-SiGe, however, diffuses over the gate insulating layer, thereby exerting an adverse influence upon a quality of the gate insulating layer, e.g., an interface trap density and a fixed charge density. If the quality of the gate insulating layer is deteriorated, there decreases the time for the memory device FET to retain the electric charges. Namely, there arises a problem in which a memory device FET's capability of retaining the electric charges declines because of using poly-SiGe for the gate electrode.

Further, in the eDRAM, silicide is provided in self-alignment manner on upper portions of the gate electrodes of the logic device FET and of the memory device FET, respectively, employing a so-called SALICIDE (Self-ALIgned siliCIDE) process. Silicide is used also for a word line. Silicide serves to decrease both of a resistance of the gate electrode and a resistance of the word line connected to the memory device FET. A speed of the eDRAM is thereby increased.

If a thickness of the poly-SiGe layer is comparatively small, a metal in silicide diffuses up to the gate insulating layer. Accordingly, the poly-SiGe layer must be thick enough for the metal within the silicide not to reach the gate insulating layer.

On the other hand, in the logic device FET, a short channel effect such as punch-through and so on is caused due to a hyperfine structure. The impurities are implanted at an angle of inclination from a direction perpendicular to the surface of the semiconductor substrate for preventing the short channel effect. This impurity implantation is known as a halo implantation.

A distance between the adjacent gate electrodes in the logic region and a distance between the adjacent gate electrodes in the memory region, are designed the same in some cases. Namely, there exist some semiconductor devices in which the distance between the adjacent gate electrodes in the logic region is determined based on a minimum design rule.

In such a case, if a height of the gate electrode from the surface of the semiconductor substrate is comparatively large, the halo implantation is hindered by the adjacent gate electrode in the logic region, and the impurities are not implanted into the semiconductor substrate in some cases. Accordingly, the height of the gate electrode in the logic region must be low to such an extent that the impurities can be implanted by the halo implantation.

Hence, the poly-SiGe layer must be thick enough for the metal in silicide not to reach the gate insulating layer and be thin enough to enable the halo implantation to be carried out.

Moreover, a higher voltage is applied to the gate insulating layer in the memory device FET than in the logic device FET. Hence, a withstand voltage of the memory gate insulating layer of the memory device FET must be higher than that of the logic gate insulating layer of the logic device FET. If the gate insulating layer of the memory device FET is too thin, the electric charges conduct by direct tunneling) the gate insulating layer, and consequently the electric charge retention capability declines. This leads to deterioration of a retention time of the memory device FET.

Accordingly, the memory gate insulating layer must be formed thicker than the logic gate insulating layer.

It is, however, impossible to provide the gate insulating layers each having a different thickness on the same semiconductor substrate in the same process. Therefore, the gate insulating layers are provided in different processes respectively in the memory region and in the logic region.

A conventional method for providing the gate insulating layers each having the different thickness on the same semiconductor substrate, involves at first providing a comparatively thick memory gate insulating layer, e.g., a silicon oxide layer over the entire semiconductor substrate, providing next a mask layer on the gate insulating layer in the memory region, and selectively removing the gate insulating layer existing in the logic region. Then, after removing the mask layer, a comparatively thin logic gate insulating layer is provided over the entire semiconductor substrate.

When the mask layer is provided on the gate insulating layer, however, a quality of the gate insulating layer declines due to a stress and contamination that are given to the gate insulating layer from the mask layer.

If the quality of the memory gate insulating layer declines, the electric charge retention capability decreases, which leads to the deterioration of the retention time of the memory device FET. Further, the electric charges are trapped by a defect in the gate insulating layer, and the device function as a memory is degraded.

Further, if the thickness of the memory gate insulating layer is large enough to receive almost no influence in the processes of providing the logic gate insulating layer, e.g., in a cleaning process using hydrogen fluoride and in an oxidizing process, the conventional method is effective. The memory gate insulating layer is relatively thicker than the logic gate insulating layer, however, its absolute thickness has been becoming thinner and thinner over the recent years.

Accordingly, a problem is that the process of providing the logic gate insulating layer changes the thickness of the memory gate insulating layer.

SUMMARY OF THE INVENTION

According to one embodiment of the present invention, there is provided a semiconductor device comprising:
  a semiconductor substrate;
  a first gate electrode constructed of a multi-layered stack member provided in a memory region, formed with memory cells, of a surface area of said semiconductor substrate so that said first gate electrode is insulated by a first insulating layer from said semiconductor substrate; and
  a second gate electrode provided in a logic region, formed with a logic circuit for controlling at least said memory cells, of the surface area of said semiconductor substrate so that said second gate electrode is insulated by a second insulating layer from said semiconductor substrate,
  wherein said layer, brought into contact with said first insulating layer, of said first gate electrode and said layer, brought into contact with said second insulating layer, of said second gate electrode, are composed of materials different from each other.

According to one embodiment of the present invention, there is provided a method of manufacturing a semiconductor device comprising:
  defining a memory region for providing memory cells and a logic region for providing a logic circuit for controlling said memory cells, said memory and logic regions being isolated by a device isolation region on a semiconductor substrate;
  providing a first insulating layer on said semiconductor substrate;
  selectively removing said first insulating layer existing on said logic region in a surface area of said semiconductor substrate;
  stacking an amorphous silicon layer on said semiconductor substrate; and
  effecting a thermal treatment upon said semiconductor substrate in order to alter said amorphous silicon layer existing on said memory region into a polycrystalline semiconductor layer and to alter said amorphous silicon layer existing on said logic region into a silicon monocrystalline layer.

BRIEF DESCRIPTION OF THE DRAWINGS

In the accompanying drawings.

DETAILED DESCRIPTION OF THE INVENTION

Some embodiments of the present invention will hereinafter be described in depth with reference to the accompanying drawings. Note that the respective embodiments do not limit the present invention. Further, each component is depicted emphatically to some extent for facilitating the understanding throughout the accompanying drawings.

Figure 1:
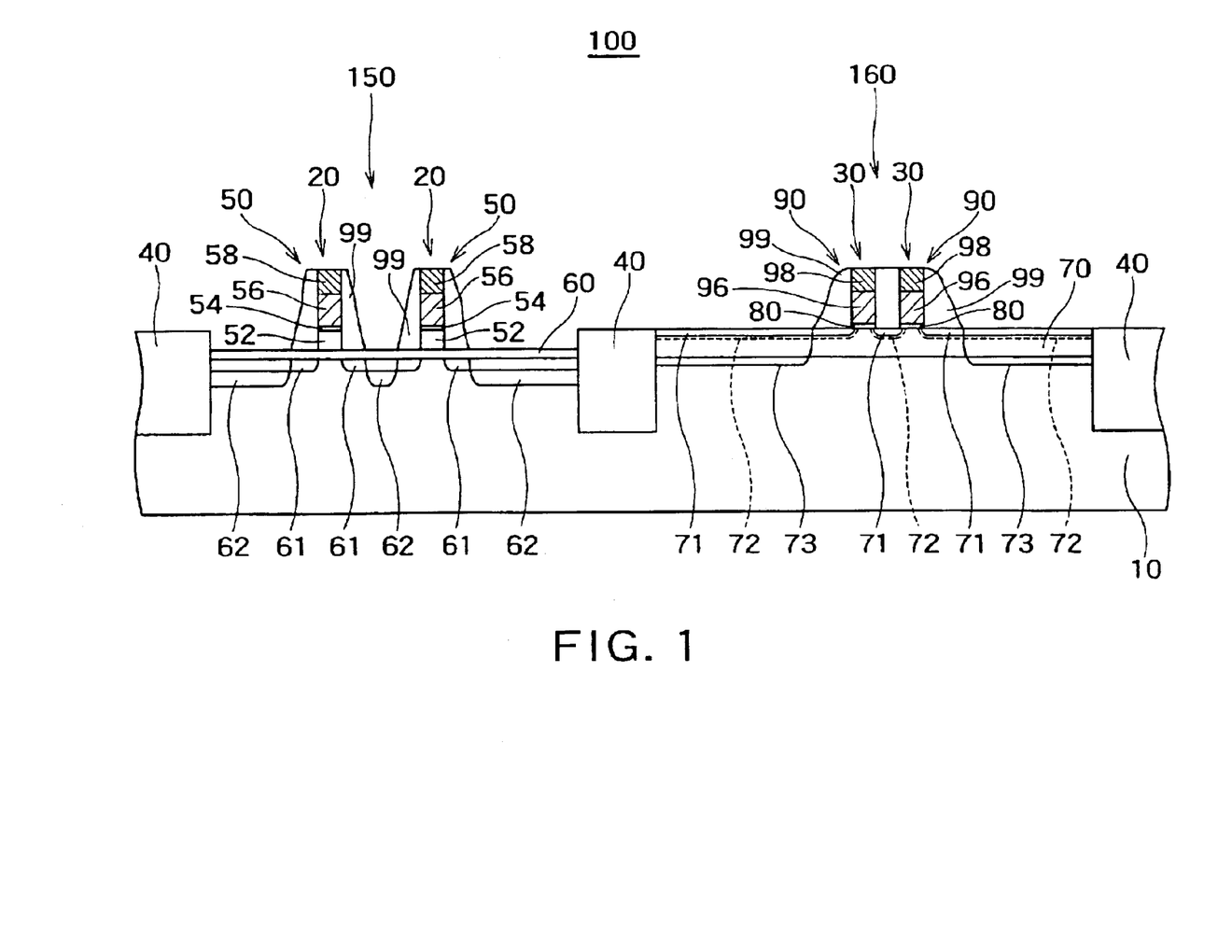
FIG. 1 is a device sectional view in one embodiment of a semiconductor device according to the present invention.

FIG. 1 is an enlarged sectional view of a semiconductor device 100 in an embodiment according to the present invention. The semiconductor device 100 is provided on the surface of a semiconductor substrate 10. The surface of the semiconductor device 100 is isolated into a memory region 150 and a logic region 160. A device isolation layer 40 functions as a device isolation between the memory region 150 and the logic region 160.

In the following drawings of FIGS. 1 through 8, only two pieces of memory device oriented FETs 20 adjacent to each other and two pieces of logic device oriented FETs 30 adjacent to each other, are illustrated and will therefore be explained.

The memory device FETs 20 are provided in the memory region 150, and the logic device FETs 30 are provided in the logic region 160.

The memory device FETs 20 in the memory region 150 may be classified as, e.g., N-type FETs and constitute DRAM cells together with unillustrated capacitors. Normally, the DRAM cells are arrayed in matrix and thus configure a memory array. Note that both of stack type and trench type capacitors are usable as the capacitors unillustrated in FIG. 1.

In this memory region 150, a silicon oxide layer 60 is provided as a gate insulating layer on the surface of the semiconductor substrate 10. According to the present embodiment, the silicon oxide layer 60 is approximately 5 nm in thickness.

A gate electrode 50 electrically insulated from the semiconductor substrate 10 by the silicon oxide layer 60 is provided on the silicon oxide layer 60.

In the memory region 150, low-density shallow N-type diffused layers 61 facing to each other with a channel region interposed therebetween and high-density deep N-type diffused layers 62 spaced farther away from the channel region, are provided on the surface of the substrate, the channel region corresponding to an area just under the gate electrode 50.

On the other hand, the logic device FETs 30 in the logic region 160 are classified as N- and P-type FETs and constitute logic circuits. Normally, the logic device FETs 30 configure not only peripheral circuits for controlling the DRAM but also a variety of other high-speed arithmetic function units.

In the logic region 160, a silicon monocrystalline layer 70 is provided on the surface of the semiconductor substrate 10. In this embodiment, the silicon monocrystalline layer 70 is about 50 nm thick.

A silicon oxide layer 80 is provided as a gate insulating layer on the silicon monocrystalline layer 70. In the present embodiment, the silicon oxide layer 80 is equal to or smaller than 2 nm in thickness.

A gate electrode 90 electrically insulated from the semiconductor substrate 10 by the silicon oxide layer 80, is provided on the silicon oxide layer 80.

Each of the gate electrode 50 and the gate electrode 90 is composed of a plurality of layers. To be more specific, the gate electrode 50 includes a polycrystalline silicon layer 52 provided on the silicon oxide layer 60, a silicon oxide layer 54 provided on the polycrystalline silicon layer 52, a poly-SiGe layer 56 provided via the silicon oxide layer 54 on the polycrystalline silicon layer 52, and a silicide layer 58 provided on this poly-SiGe layer 56.

On the other hand, the gate electrode 90 includes a poly-SiGe layer 92 provided on the silicon oxide layer 80, and a silicide layer 98 provided on this poly-SiGe layer 96. The silicide layers are provided not only on the upper portion of the gate electrode but also on other polycrystalline silicon wires.

Note that if cobalt is used for forming the silicide layer, the cobalt penetrates into the poly-SiGe layer 96 and causes contamination or a defect of the gate oxide layer or the semiconductor substrate. By contrast, nickel does not, it is empirically confirmed, penetrate into the poly-SiGe layer 96. It is therefore preferable that the silicide layers 58 and 98 be composed of silicide of silicon and nickel.

Protection layers 99 are stacked along peripheral side walls respectively of the gate electrode 50 provided in the memory region 150 and of the gate electrode 90 provided in the logic region.

As described above, a contact portion, with the silicon oxide layer 60, of the gate electrode provided in the memory region 150 is composed of the polycrystalline silicon 52. On the other hand, a contact portion, with the gate insulating layer 80, of the gate electrode 90 provided in the logic region 160 is composed of the poly-SiGe layer 96. Namely, the contact portions, with the silicon oxide layers 60 and 80, of the gate electrodes 50 and 90 in the two regions are composed of the materials different from each other. This kind of difference in the gate structure yields a variety of effects that follow.

In the memory region 150, the polycrystalline silicon layer 52 exists between the silicon oxide layer 60 and the poly-SiGe layer 56. This configuration prevents germanium from being diffused into the silicon oxide layer 60 from the poly-SiGe layer 56. Accordingly, no influence is exerted upon a quality of the gate insulating layer. Hence, an electric charge retention capability of the memory device FET 2o does not decline.

Further, the silicon oxide layer 54 provided simultaneously with the silicon oxide layer 80 exists between the polycrystalline silicon layer 52 and the poly-SiGe layer 56. In general, however, if the thickness of the silicon oxide layer is equal to or smaller than 2 nm, direct tunneling carrier conduction is dominant. The silicon oxide layer 54 is 2 nm or smaller in thickness. Accordingly, the electric charges flow through between the polycrystalline silicon 52 and the poly-SiGe layer 56 substantially by the direct tunnel conduction. Further, a voltage applied across the gate electrode 50 is comparatively high, so that a sufficiently large electric current can flow to the silicon oxide layer 60. Moreover, the memory device FET does not require corresponding to a signal having a frequency as high as the logic device FET. Accordingly, the memory device FET may not take an RC delay into consideration. Hence, there is no problem about a resistance between the polycrystalline silicon 52 and the poly-SiGe layer 56. Namely, the silicon oxide layer 54 does not hinder the conduction of the electric charges between the polycrystalline silicon 52 and the poly-SiGe layer 56.

Further, in the memory region 150, the polycrystalline silicon layer 52 and the poly-SiGe layer 56 exist between the silicide layer 58 and the silicon oxide layer 60. Hence, a metal from the silicide layer 58 does not diffuse into the silicon oxide layer 60. Accordingly, the quality of the gate insulating layer does not deteriorate. As a result, the electric charge retaining capability of the memory device FET 20 does not decline.

Moreover, the gate electrode 50 includes the polycrystalline silicon layer 52. Therefore, the gate electrode 50 has a higher height in the vertical direction from the surface of the semiconductor substrate 10 than the gate electrode 90. With this configuration, an impurity implanted by the halo implantation does not reach the silicon oxide layer 60 (see FIG. 8). Owing to the halo implantation, the silicon oxide layer 60 is not damaged.

On the other hand, in the logic region 160, the poly-SiGe layer 96 is provided on the silicon oxide layer 80, and hence boron in the gate electrode of the P-type FET is, as will be explained later on referring to FIG. 10, more activated by adjusting a concentration of Ge in the poly-SiGe layer 96. This leads to an increase in carriers within the gate electrode of the P-type FET and therefore a depletion layer becomes hard to form. Namely, a capacitance $C_{OX}$ between the gate electrode and the semiconductor substrate does not decrease from ideal value. A threshold value of the logic device FET and a driving current are thereby kept.

Further, in the logic region, the gate electrode 90 does not include the polycrystalline silicon layer. Accordingly, a height of the gate electrode 90 itself is lower than a height of the gate electrode 50 itself, however, the thickness of the silicon oxide layer 60 is smaller than that of the silicon monocrystalline layer 70, so that the heights of the upper surfaces of the gate electrodes 50 and 90 in the vertical direction from the surface of the semiconductor substrate 10, are substantially equal to each other. With this configuration, the halo implantation can be effectively done with this respect to the semiconductor substrate 10 in the logic region 160 (see FIG. 7). The halo implantation can prevent a short channel effect of the logic device FET (see FIG. 9).

Next, an embodiment of a method for manufacturing the semiconductor device according to the present invention, will be described.

FIGS. 2 through 6 are sectional views of the semiconductor device having the memory device FETs and the logic device FETs, showing the method for manufacturing the semiconductor device 100 on a step-by-step basis in the embodiment of the present invention.

Figure 2:
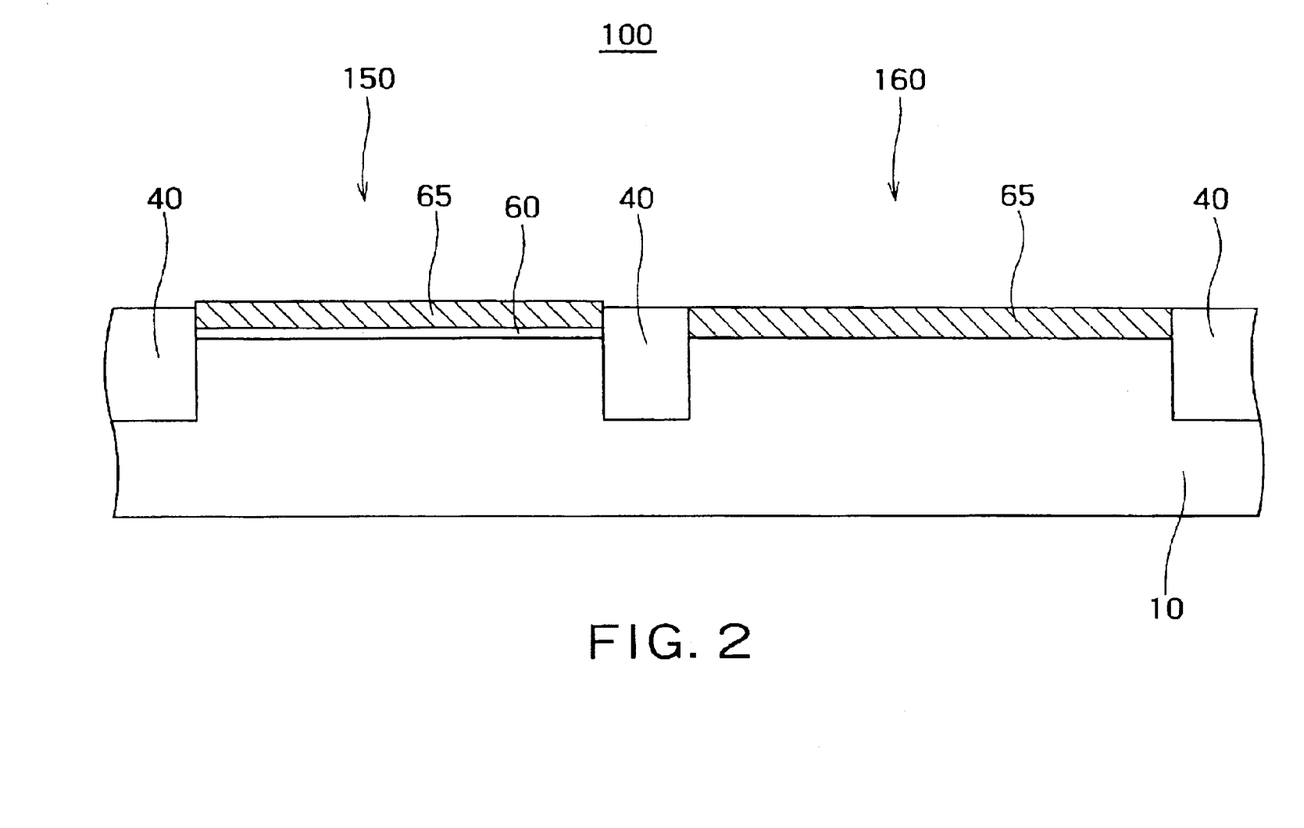
FIG. 2 is a device sectional view showing a process in one embodiment of a semiconductor device manufacturing method according to the present invention.

As shown in FIG. 2, for example, a trench-shaped device isolation layer 40 separates the surface area of the semiconductor substrate 10. Next, the semiconductor substrate 10 is oxidized by thermal oxidation and so on, whereby the silicon oxide layers 60 having a thickness on the order of 5 nm are provided on the surface of the semiconductor substrate 10, to be specific, both in the memory region 150 and in the logic region 160. Thereafter, the silicon oxide layer in the logic region 160 is selectively etched, and the silicon oxide layer 60 remains in the memory region 150. This remaining silicon oxide layer 60 has a function as the gate insulating layer of the memory device FET 20.

Subsequently, an amorphous silicon layer 65 is stacked on the semiconductor substrate. The amorphous silicon layer 65 is about 50 nm thick. Further, the amorphous silicon layer 65 is annealed at a temperature as low as 700° C. or lower.

Figure 3:
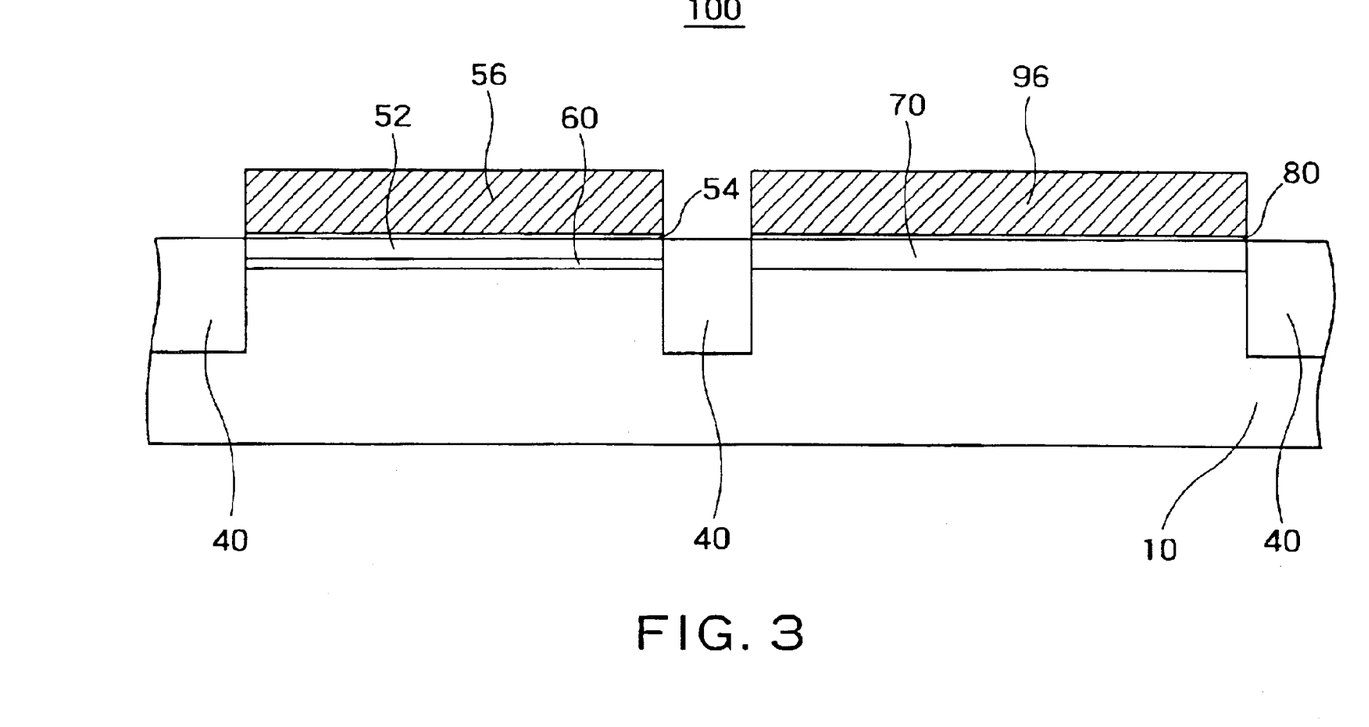
FIG. 3 is a device sectional view showing a process subsequent to the process shown in FIG. 2 in one embodiment of a semiconductor device manufacturing method according to the present invention.

As illustrated in FIG. 2, the amorphous silicon layer 65 in the memory region 150 is stacked on the silicon oxide layer 60. With this configuration, as a result of annealing, the amorphous silicon layer 65 is, as depicted in FIG. 3, transformed into the polycrystalline silicon layer 52 having a comparatively large grain.

By contrast, the amorphous silicon layer 65 in the logic region 160 is stacked on the semiconductor substrate 10, more specifically, on the silicon monocrystal. With this configuration, as a result of annealing, the amorphous silicon layer 65 is epitaxial-grown on the semiconductor substrate 10 and transformed into the silicon monocrystalline layer 70.

Note that the channel impurity may be implanted comparatively shallow into the surface of the semiconductor substrate 10 before the amorphous silicon layer 65 is stacked in the logic region 160. With this configuration, when annealing, the silicon monocrystalline layer 70 is provided, and simultaneously the impurity diffuses, thereby forming an impurity concentration distribution in the direction vertical to the surface of the semiconductor substrate 10. This impurity concentration distribution takes such a profile that the impurity concentration gradually increases towards a boundary between the silicon monocrystalline layer 70 and the semiconductor substrate 10 from the surface of the silicon mono crystalline layer 70. Hence, this concentration distribution is known as a super steep retrograde channel profile (SSRCP).

According to this embodiment, the SSRCP can be easily formed. This SSRCP prevents the short channel effect such as punch-through in the channel, and improves a current drive capability of the drain current and so forth.

As discussed above, according to the present embodiment, the amorphous silicon layers 65 are stacked both in the memory region 150 and in the logic region 160, and the silicon monocrystalline layer 70 is provided only in the logic region 160 by annealing. The silicon monocrystalline layer 70 and the polycrystalline silicon layer 52 can, however, be simultaneously provided by the selective epitaxial growth method without stacking the amorphous silicon layer 65. This is because the silicon crystal serving as a seed is exposed and the silicon monocrystal is grown in the logic region 160 on one hand, and in the memory region 150 the silicon oxide layer is exposed and the polycrystalline silicon is provided on the other hand.

Next, as shown in FIG. 3, the surface of the polycrystalline silicon layer 52 and the surface of the silicon monocrystalline layer 70 are oxidized, respectively. The silicon oxide layers 54 and 80 are thereby provided in the memory region and the logic region, respectively. In this embodiment, a thickness of each of these silicon oxide layers 54 and 80 is equal to and smaller than 2 nm. The silicon oxide layer 80 has a function as the gate insulating layer of the logic device FET 30.

Further, the silicon oxide layer 54 remains in the memory device FET 20 but is, as explained above, thin enough for the direct tunnel conduction of the electric charges to occur, and hence there is no necessity of removing the silicon oxide layer 54. The silicon oxide layer 54 rather prevents germanium out of the poly-SiGe layer 56 and the metal out of the silicide layer 58 from being diffused into the polycrystalline silicon layer 52. Hence, the existence of the silicon oxide layer 54 is desirable to the memory device FET 20 having no necessity of corresponding to the frequency as high as the logic device FET 30.

Moreover, when the silicon oxide layer 80 is provided, the silicon oxide layer 60 in the memory region 150 has already been covered with the polycrystalline silicon layer 52. Hence, there is not influenced by a cleaning process using hydrogen fluoride and so forth when the gate insulating layer is provided in the logic region as done in the prior art. The quality of the silicon oxide layer 60 in this embodiment can be thereby kept good without any deterioration.

Next, the poly-SiGe layers 56 and 96 are stacked on the silicon oxide layers 54 and 89. The poly-SiGe later 56 in the N-type FET region is doped with an N-type impurity, e.g., phosphorus, and the poly-SiGe layer 56 in the P-type FET region is doped with a P-type impurity, e.g., boron.

Figure 4:
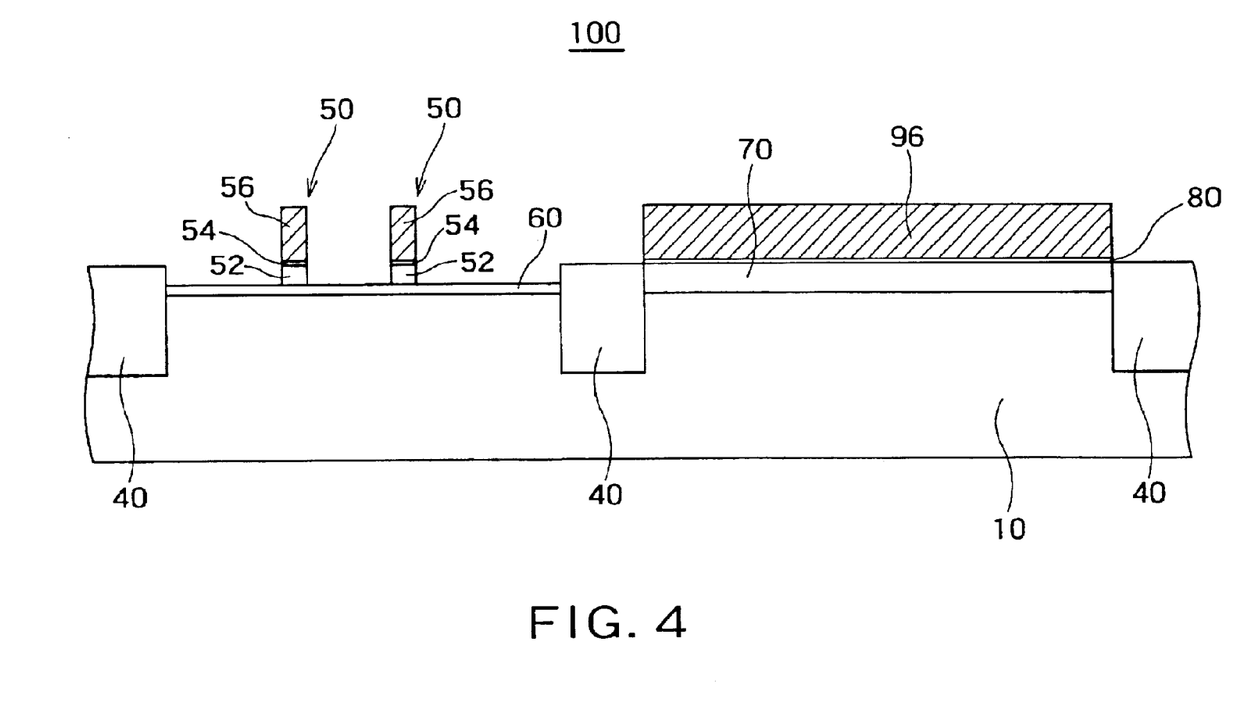
FIG. 4 is a device sectional view showing a process subsequent to the process shown in FIG. 3 in one embodiment of a semiconductor device manufacturing method according to the present invention.
Figure 5:
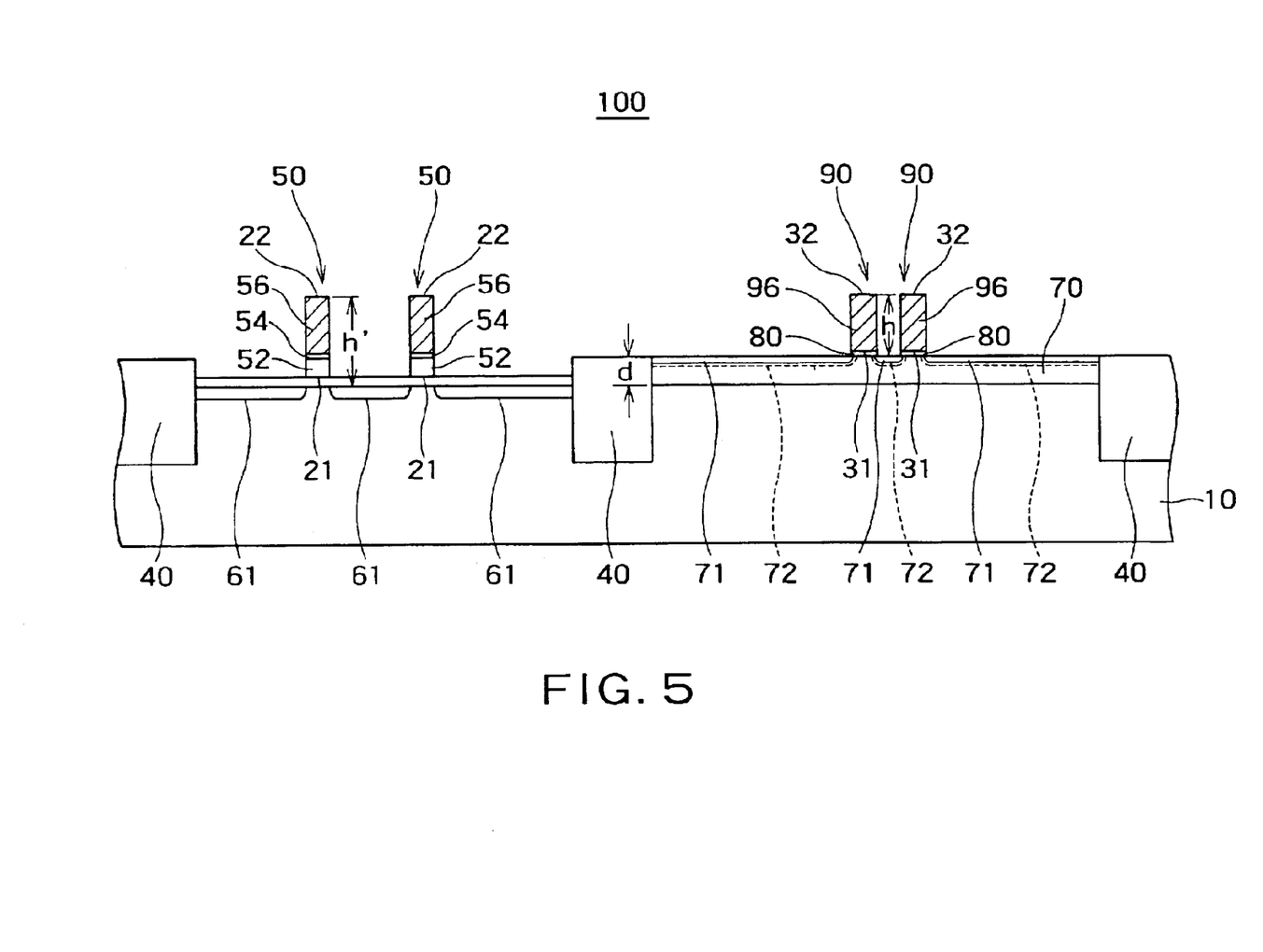
FIG. 5 is a device sectional view showing a process subsequent to the process shown in FIG. 4 in one embodiment of a semiconductor device manufacturing method according to the present invention.

Subsequently, as shown in FIGS. 4 and 5, the stacked areas explained so far undergo patterning in predetermined shapes, whereby the gate electrodes 50 and 90 are respectively configured.

As discussed above with reference to FIG. 1, the structural difference is that the gate electrode 50 has 3-layered structure consisting of the polycrystalline silicon layer 52, the silicon oxide layer 54 and the poly-SiGe layer 56, and the gate electrode 90 has a mono-layered structure consisting of the poly-SiGe layer 96. It is therefore required that the lithography process and the RIE process be conducted for the gate electrode 50 and the gate electrode 90, separately.

Then, as illustrated in FIG. 5, after the gate electrodes 50 and 90 have been provided, an extension implantation and the halo implantation are carried out. These types of ion implantations are executed, thereby providing an extension diffused layer 61 in the memory region, an extension diffused layer 71 in the logic region and a halo region 71 extending along peripheries thereof.

Herein, a reason why the halo region is formed only in the logic portion will be elucidated.

As obvious referring to FIG. 5, the surface of the semiconductor substrate 10 in the memory region 150 is not flush with the surface of the silicon monocrystalline layer 70 in the logic region 160. More specifically, the silicon monocrystalline layer 70 exists within the plane spaced by a thickness d of the silicon monocrystalline layer 70 away from the surface of the semiconductor substrate 10. Accordingly, respective positions in which to start forming the gate electrode 50 and the gate electrode 90, are different at a height based on the surface of the semiconductor substrate 10. Namely, a bottom surface 21 of the gate electrode 50 and a bottom surface 31 of the gate electrode 90 exist at heights different from each other on the basis of the surface of the semiconductor substrate 10. To be more specific, there is established a relationship such as h<h', where h is a height of the gate electrode 90 on the basis of the surface of the silicon monocrystalline layer 70, and h' is a height of the gate electrode 50 from the surface of the semiconductor substrate 10. In other words, it may be said that the gate oxide layer 60 and the gate oxide layer 80 are provided at the heights different from each other on the basis of the surface of the semiconductor substrate 10.

As a result, as will be explained later on with reference to FIGS. 7 and 8, the halo implantation enables the impurity to be implanted into the logic region 160 but not to be in the memory region 150.

On the other hand, the heights of the poly-SiGe layers 56 and 96 on the basis of the surface of the semiconductor substrate 10 are equal. Hence, the poly-SiGe layers 56 and 96 can be formed by the same process. This therefore facilitates manufacturing the semiconductor device 100.

Moreover, an upper surface 22 of the gate electrode 50 and an upper surface 32 of the gate electrode 90 are flush with each other on the basis of the surface of the semiconductor substrate 10. Namely, the gate electrode 50 and the gate electrode 90 protrude at the equal height from the semiconductor substrate 10.

As a result, when polishing the passivation layer etc provided on the semiconductor substrate 10 by chemical mechanical polishing (CMP), there does not arise any problem such as dishing in which the semiconductor substrate and the gate electrode are to be partially polished like a dish and so on, thereby performing uniform polishing. As a consequence, there are not caused a defect in the device formed on the semiconductor substrate and a crack in the semiconductor substrate itself.

Further, as the thickness of the gate electrode 50 is smaller than the thickness of the gate electrode 90, an etching quantity when forming the gate electrode 50 is smaller than when forming the gate electrode. This makes it comparatively difficult for a taper to be formed along the side wall of the gate electrode 90.

Figure 6:
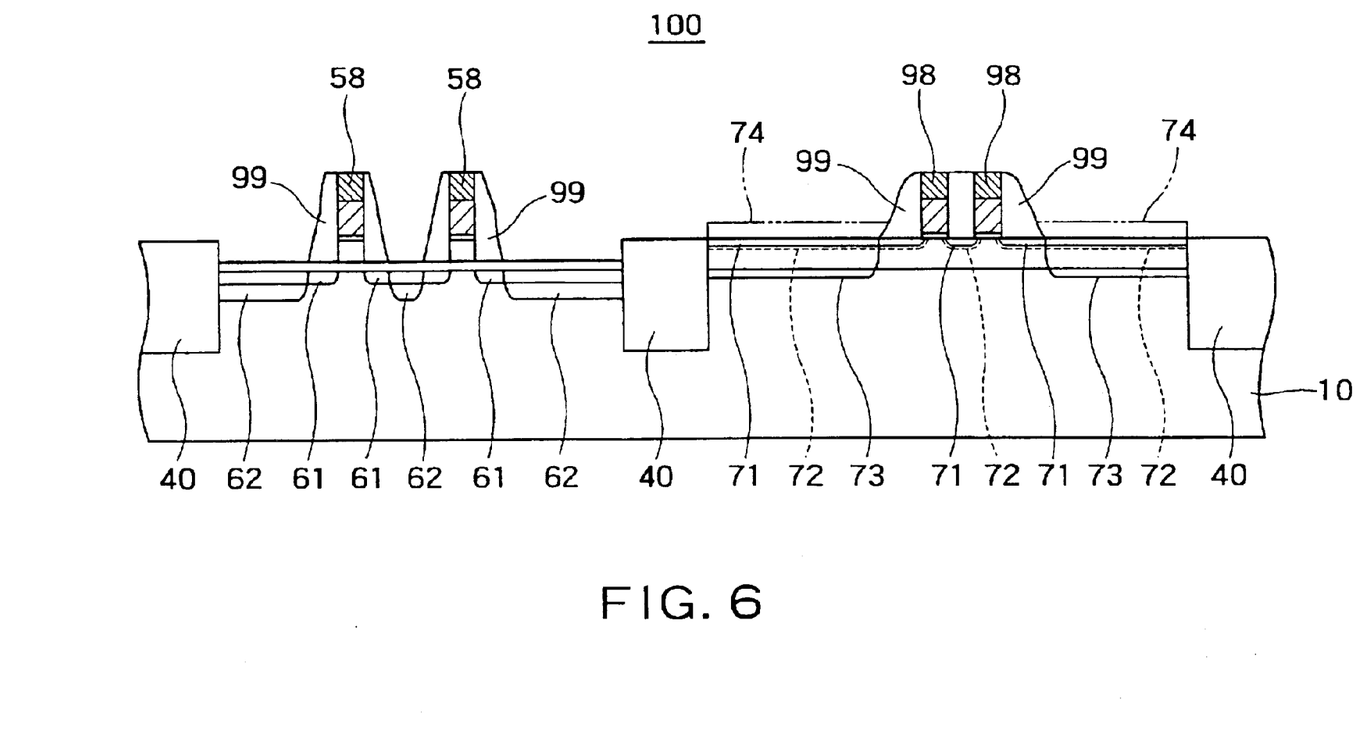
FIG. 6 is a device sectional view showing a process subsequent to the process shown in FIG. 5 in one embodiment of a semiconductor device manufacturing method according to the present invention.

Next, as shown in FIG. 6, protection layers 99 composed of dielectrics, e.g., silicon oxide or silicon nitride are stacked on the gate electrodes 50 and 90.

Subsequently, the protection layers 99 are etched back and remain on the side walls of the gate electrodes so that the surfaces of the poly-SiGe layers 56 and 96 are exposed.

Then impurities are implanted into the semiconductor substrate 10 in order to provide a source diffused layer and a drain diffused layer, whereby a source/drain layer 62 is provided in the memory region, and a source/drain area 73 is formed in the logic region. On this occasion, since the implanted ions in the memory region are different from those in the logic region, there is necessity of masking one region with a resist and so forth when implanting the ions. Further, the ion-implanted region can be self-aligned with the gate sidewalls.

Further, nickel undergoes sputtering. Nickel silicide layers 58 and 98 are thereby provided in self-alignment with the gate electrodes 50 and 90. Note that the silicide layer is provided also on the polycrystalline silicon wire used as an interconnect wire.

The silicide layers 58 and 98 have extremely small resistances, and hence, with the formations thereof, the resistances of the gate electrodes 50 and 90 decrease. Similarly, the silicide layer on the polycrystalline silicon wire reduces a resistance of the interconnect wire.

Moreover, a passivation layer is stacked over the whole, contact holes are formed in a predetermined positions, metals are vapor-deposited so as to fill these contact holes, then patterning is effected thereon to provide metal wires (not shown), thus completing the semiconductor device 100.

In the embodiment discussed above, the selective epitaxial process may be added before providing the silicide layers 58 and 98. An epitaxial layer 74 is thereby further provided on the silicon monocrystalline layer 70 in the logic region 160. The epitaxial layer 74 is depicted by the broken line in FIG. 6.

This epitaxial layer 74 has a function of decreasing a depth of each of the source/drain diffused layers of the logic device FETs 30 when implanting the ions for forming the source and the drain. The source/drain diffused layers become shallower, thereby preventing the short channel effect such as the punch-through.

Moreover, the epitaxial layer 74 also has a function of preventing a direct contact of the silicide layer with the silicon monocrystalline layer 70. The silicon monocrystalline layer 70 and the semiconductor substrate 10 are thereby prevented from being contaminated with the metals, and a junction leakage current can be reduced.

Figure 7:
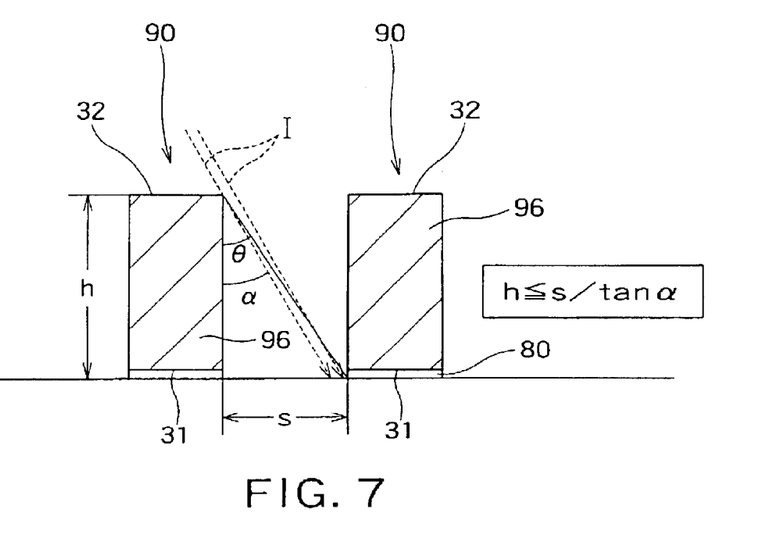
FIG. 7 is a sectional view of an electrode, showing a relationship between a gate electrode of a logic device FET in FIG. 5 and a halo implantation.

FIG. 7 is a further enlarged sectional view of the gate electrode 90 of the logic device FET 30 in FIG. 5. FIGS. 7 and 8 illustrate how the impurities are implanted by the halo implantation. In the halo implantation process, the silicide layer is not yet provided on the gate electrode 90. In this state, the halo implantation is carried out.

The halo implantation is that the impurities are implanted obliquely at an angle α in the direction perpendicular to the surface of the semiconductor substrate 10 (see an arrowhead I of the broken line). The angle α is 30° through 60°. When the impurities are implanted by the halo implantation towards the channel from the lower edge of the gate electrode 90, the threshold value of the logic device FET 30 is effectively controlled, and the short channel effect is also prevented.

A minimum distance s between the gate electrodes 90 adjacent to each other becomes narrower as the device gets hyper-finer. Accordingly, the angle α is actually 30° to 45°.

It is assumed that h be a height from the bottom surface of the gate insulating layer 80 up to the upper surface of the gate electrode 90. The height h is equal to a height of the upper surface 32 on the basis of the surface of the silicon monocrystalline layer 70.

If the angle α in the halo implantation is fixed, the height h is determined so as to meet the following relationship:

$$h \leq s/\tan \alpha \quad \text{(Formula 1)}$$

This is because the impurities in the halo implantation can be implanted into the semiconductor substrate 10 in the logic region 160 by setting the height h so as to meet the relationship defined by the formula 1.

Figure 8:
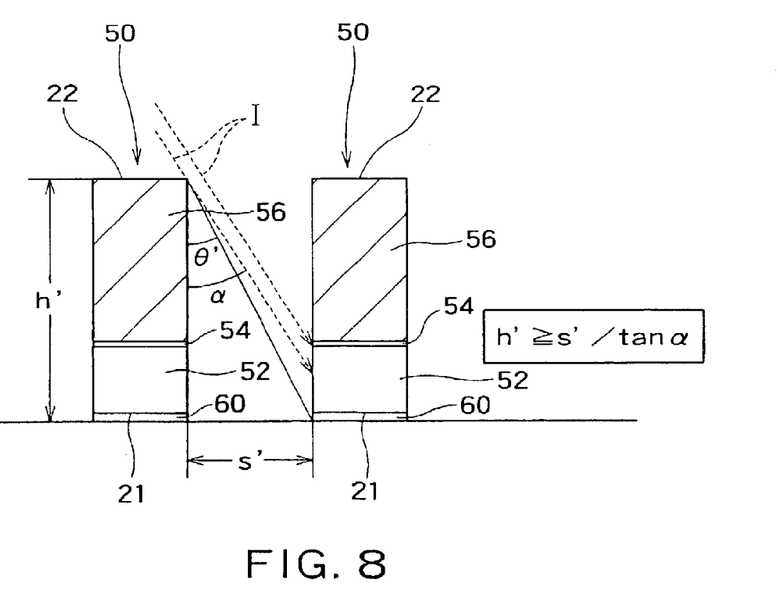
FIG. 8 is a sectional view of the electrode, showing a relationship between the gate electrode of a memory device FET in FIG. 5 and the halo implantation.

FIG. 8 is an enlarged sectional view of the gate electrode 50 of the memory device FET 20 shown in FIG. 5. In this state, the halo implantation is carried out.

Let s' be a minimum distance between the gate electrodes 50 neighboring to each other, and let h' be a height from the surface of the semiconductor substrate 10 up to the upper surface 22 of the gate electrode 50.

If the angle α in the halo implantation is fixed, the height h' is determined so as to satisfy the following relationship:

$$H' \geq s'/\tan \alpha \quad \text{(Formula 2)}$$

The height h' is set to meet the relationship in the formula 2, whereby the impurities based on the halo implantation are hindered by the side wall of the gate electrode 50 and are not implanted into the semiconductor substrate 10 in the memory region 150 (see the arrowhead I of the broken line). Note that the relationships in the formulae 1 and 2 are not necessarily met in the example shown in FIG. 1.

The logic device FET 30 needs the halo implantation, however, the memory device FET 20 does not need the halo implantation under the same condition. The halo implantation rather might cause damages to the silicon oxide layer 60 in the memory region 150 and to the semiconductor substrate 10. Therefore, according to the prior art, the memory region 150 needs to be covered with the photo resist etc when the halo implantation is carried out.

In this embodiment, however, the impurity implantation must not necessarily involve the mask process such as the photolithography. It is because the impurities can be selectively implanted into only the semiconductor substrate 10 in the logic region 160 through the halo implantation by meeting the formulae 1 and 2.

On the other hand, if the heights h and h' are fixed, a proper range of the angle α of the halo implantation is as follows:

$$\theta' \leq \alpha \leq \theta \quad \text{(Formula 3)}$$

where the angle $\theta = \tan^{-1}(h/s)$, and the angle $\theta' = \tan^{-1}(h'/s')$. The angle α is set to satisfy the relationship in the formula 3, whereby the impurities are selectively implanted into the logic region 160 by the halo implantation but not implanted into the memory region 150 by the halo implantation.

Figure 9:
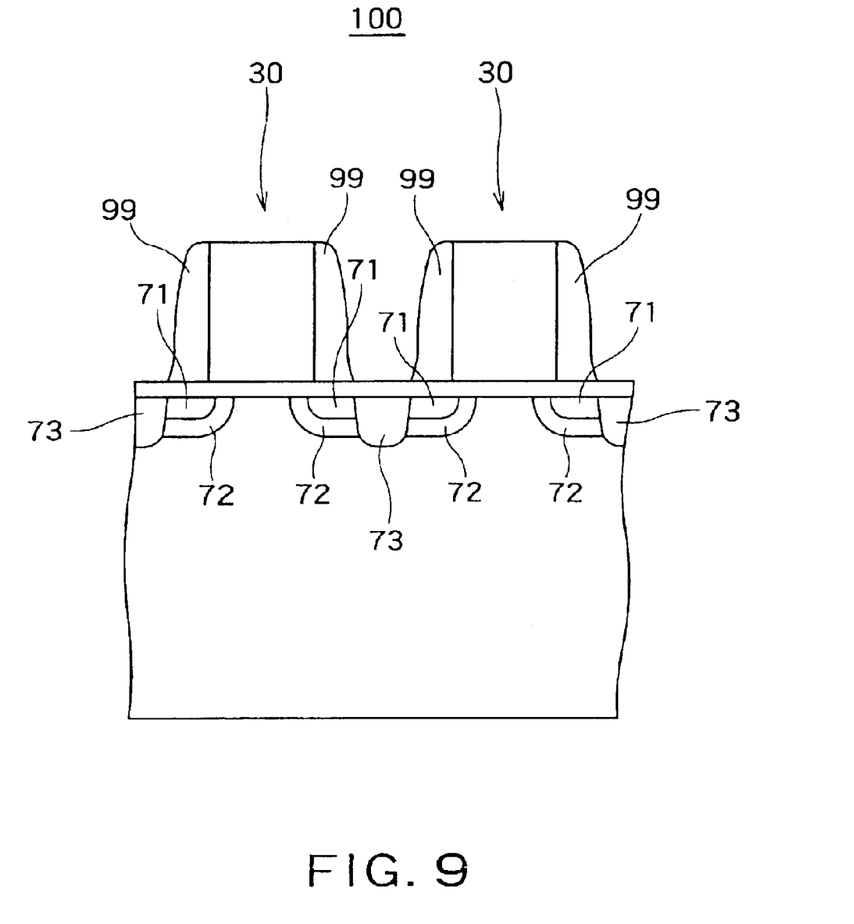
FIG. 9 is a device sectional view showing a diffused layer provided on the surface of a semiconductor substrate in a logic region.

FIG. 9 is a sectional view showing diffused layers provided on the semiconductor substrate 10 in the logic region 160. FIG. 9 depicts respective shapes of an N-type source or drain diffused layer 73, an N-type extension diffused layer 71 and a P-type halo area 72, respectively.

With the extension implantation, the extension diffused layer 71 having a concentration lower than the concentration of the impurity in the source or drain diffused layer 73, is provided in the vicinity of the channel.

The halo area 72 exhibiting a conductivity opposite to that of the extension diffused layer 71 is provided along the periphery of the extension diffused layer 71 by the halo implantation.

The extension diffused layer 71 prevents the short channel effect. Further, the halo area 72 prevents the short channel effect of the logic device FET 30, whereby the threshold value of the logic device FET 30 can be controlled.

Figure 10:
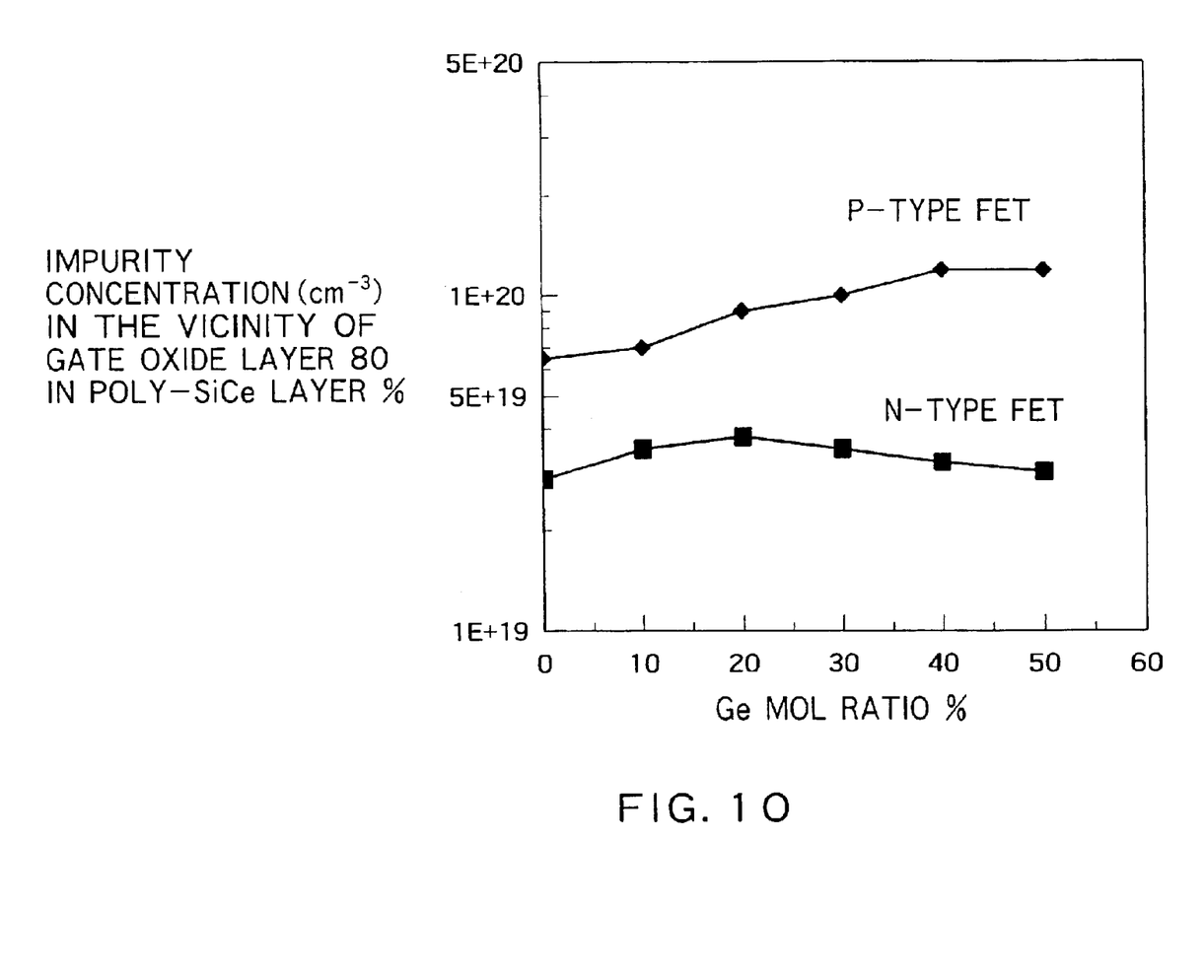
FIG. 10 is a graph showing a degree of activation of impurities within the gate electrode with respect to a content quantity of germanium contained in a poly-SiGe layer.

FIG. 10 is a graph showing a degree of activation of the impurity within the gate electrode 90 with respect to a content quantity of germanium in the poly-SiGe layer 96. The axis of abscissa indicates a mol ratio of germanium in the poly-SiGe layer 96. The axis of ordinates indicates an impurity concentration in the vicinity of the gate oxide layer 80 in the poly-SiGe layer 96 when the voltage is applied across the gate electrode 90. Note that this graph is shown in "Investigation of Poly-$Si_{1-x}Ge_x$ for Dual-Gate CMOS Technology" written by Wen-Chin Let et al., [IEEE Electron Device Letters], Vol.19, No.7, p. 247, July 1998.

Boron as a P-type impurity is doped into the poly-SiGe layer 96 of the P-type FET. On the other hand, phosphorus or arsenic as an N-type impurity is doped into the poly-SiGe layer 96 of the N-type FET.

As seen in the graph shown in FIG. 10, the impurity concentration in the vicinity of the gate oxide layer 80 in the poly-SiGe layer 96 of the P-type FET rises as the mol ratio, i.e., the content quantity of germanium within the poly-SiGe layer 96 increases. This implies that boron in the poly-SiGe layer 96 is more activated as the content quantity of germanium becomes larger.

Especially when the mol ratio of germanium within the poly-SiGe layer 96 comes to 50% from 40%, the greatest quantity of boron in the poly-SiGe layer 96 is activated. Namely, when the poly-SiGe layer 96 is composed of $Si_{1-x}Ge_x$ (X=0.4 to 0.5), the greatest quantity of boron in the poly-SiGe layer 96 is activated.

When the greatest quantity of boron is activated in the poly-SiGe layer 96, the carrier increases, and the depletion layer is hard to form in the gate electrode 90 of the P-type MOSFET. Even if the gate insulating layer 80 is comparatively thin, neither a capacitance $C_{OX}$ between the gate electrode 90 and the semiconductor substrate 10 nor the current drive capability of the logic device FET 30 is thereby decreased.

Note that when the mol ratio of germanium in the poly-SiGe layer 96 comes to about 20% in the N-type FET, the largest quantity of phosphorus is activated.

According to this embodiment, the silicon oxide layer is used as the gate insulating layer, however, other insulating layers, e.g., a silicon nitride layer and a silicon carbide layer may also be used without being limited to the silicon oxide layer.

Further, the effects of the present invention are not lost even if the conductivity types of the respective components in the embodiment discussed above are reversed.

As discussed above, in the semiconductor device according to one embodiment of the present invention, the layer, which is brought into contact with the gate electrode, in the gate electrode of the memory device FET provided in the memory region on the substrate and the layer, which is brought into contact with the gate electrode, in the gate electrode of the logic device FET provided in the logic region on the same substrate, are provided differently, so that the impurity in the gate electrode of the logic device FET is activated without any decline of quality of the gate insulating layer in the memory device FET.

Moreover, the method for manufacturing the semiconductor device according to one embodiment of the present invention involves selectively providing the gate insulating layer in the memory region on the same substrate, thereafter stacking the same gate electrode material layer in the memory region and in the logic region, and altering them by the thermal treatment into materials different in these two regions, thereby keeping the current drive capability in the logic device FET provided in the logic region and preventing the short channel effect.

What is claimed is:

1. A semiconductor device comprising:
   a semiconductor substrate;
   a first gate electrode structure having first stacked layers formed on a first insulating film deposited on a surface of said semiconductor substrate in a memory cell area where memory cells are formed;
   a second gate electrode structure having second stacked layers formed on a second insulating film deposited on a surface of said semiconductor substrate in a logic circuit area where logic circuits are formed;
   wherein a first lowermost layer in said first stacked layers and a second lowermost layer in said second stacked layers comprise different materials;
   wherein said first lowermost layer contacting with said first insulating layer is a polycrystalline silicon layer, and
   said second lowermost layer contacting with said second insulating layer is a first polycrystalline silicon germanium layer;
   wherein said first gate electrode structure comprises a second polycrystalline silicon germanium layer provided on said polycrystalline silicon layer through a third insulating layer that is electrically insulating.

2. The semiconductor device according to claim 1, comprising silicide layers provided on said first polycrystalline silicon germanium layer and on said second polycrystalline silicon germanium layer.

3. The semiconductor device according to claim 2, wherein said third insulating layer has a thickness that enables a direct tunnel conduction of electric charges through between said second polycrystalline silicon germanium layer and said polycrystalline silicon layer.

4. A semiconductor device comprising:
   a semiconductor substrate;
   a first gate electrode structure having first stacked layers formed on a first insulating film deposited on a surface of said semiconductor substrate in a memory cell area where memory cells are formed; and
   a second gate electrode structure having second stacked layers formed on a second insulating film deposited on a surface of said semiconductor substrate in a logic circuit area where logic circuits are formed;
   wherein a first lowermost layer in said first stacked layers and a second lowermost layer in said second stacked layers comprise different materials, and
   said first gate electrode structure comprises a second polycrystalline silicon germanium layer provided on said polycrystalline silicon layer through a third insulating layer that is electrically insulating.

5. The semiconductor device according to claim 4, comprising silicide layers provided on said first polycrystalline silicon germanium layer and on said second polycrystalline silicon germanium layer.

6. The semiconductor device according to claim 5, wherein said third insulating layer has a thickness that enables a direct tunnel conduction of electric charges through between said second polycrystalline silicon germanium layer and said polycrystalline silicon layer.

7. A semiconductor device comprising:
   a semiconductor substrate;
   a first gate electrode structure having first stacked layers formed on a first insulating film deposited on a surface of said semiconductor substrate in a memory cell area where memory cells are formed; and
   a second gate electrode structure having second stacked layers formed on a second insulating film deposited on a surface of said semiconductor substrate in a logic circuit area where logic circuits are formed;
   wherein a first lowermost layer in said first stacked layers and a second lowermost layer in said second stacked layers comprise different materials,
   said first lowermost layer contacting with said first insulating layer is a first polycrystalline layer,
   said second lowermost layer contacting with said second insulating layer is a second polycrystalline layer, and
   said first gate electrode structure comprises a third polycrystalline layer provided on said first polycrystalline layer through a third insulating layer that is electrically insulating.

8. The semiconductor device according to claim 7, comprising silicide layers provided on said second polycrystalline layer and on said third polycrystalline layer.

9. The semiconductor device according to claim 8, wherein said third insulating layer has a thickness that enables a direct tunnel conduction of electric charges through between said third polycrystalline layer and said first polycrystalline silicon layer.

10. A semiconductor device comprising:
   a semiconductor substrate;
   a first gate electrode structure having first stacked layers formed on a first insulating film deposited on a surface of said semiconductor substrate in a memory cell area where memory cells are formed; and
   a second gate electrode structure having second stacked layers formed on a second insulating film deposited on a surface of said semiconductor substrate in a logic circuit area where logic circuits are formed;
   wherein a first lowermost layer in said first stacked layers and a second lowermost layer in said second stacked layers comprise different materials,
   said first gate electrode structure has a height which is higher than a height of said second gate electrode structure,
   a bottom surface of said second gate electrode structure has a level which is higher than a level of a bottom surface of said first gate electrode structure with the surface of said semiconductor substrate being a reference level, and
   said first gate electrode structure has an upper surface which is substantially flush with an upper surface of said second gate electrode on the basis of the surface of said semiconductor substrate.

11. The semiconductor device according to claim 10, wherein said first insulating layer is provided directly on the surface of said semiconductor substrate, said second insulating layer is provided on a silicon monocrystalline layer provided on the surface of said semiconductor substrate, and an upper surface of said polycrystalline silicon layer and an upper surface of said silicon monocrystalline layer are flush with each other, an upper surface of said second insulating layer and an upper surface of said third insulating layer are at substantially a same level, and an upper surface of a first polycrystalline silicon germanium layer provided so as to contact with said second lowermost layer in the second stacked layers and an upper surface of a second polycrystalline silicon germanium layer provided on said polycrystalline silicon layer through a third insulating layer in the first electrode structure are flush with each other, respectively, on the basis of the surface of said semiconductor substrate.

12. A semiconductor device comprising:

a semiconductor substrate;

a first gate electrode structure having first stacked layers formed on a first insulating film deposited on a surface of said semiconductor substrate in a memory cell area where memory cells are formed; and a second gate electrode structure having second stacked layers formed on a second insulating film deposited on a surface of said semiconductor substrate in a logic circuit area where logic circuits are formed;

wherein a first lowermost layer in said first stacked layers and a second lowermost layer in said second stacked layers comprise different materials, said first gate electrode structure has a height which is higher than a height of said second gate electrode structure, a bottom surface of said second gate electrode structure has a level which is higher than a level of a bottom surface of said first gate electrode structure with the surface of said semiconductor substrate being a reference level, said first insulating layer is provided directly on the surface of said semiconductor substrate, said second insulating layer is provided on a silicon monocrystalline layer provided on the surface of said semiconductor substrate, and an upper surface of said polycrystalline silicon layer and an upper surface of said silicon monocrystalline layer are flush with each other, an upper surface of said second insulating layer and an upper surface of said third insulating layer are at substantially a same level, and an upper surface of a first polycrystalline silicon germanium layer provided so as to contact with said second lowermost layer in the second stacked layers and an upper surface of a second polycrystalline silicon germanium layer provided on said polycrystalline silicon layer through a third insulating layer in the first electrode structure are flush with each other, respectively, on the basis of the surface of said semiconductor substrate.

13. A semiconductor device comprising:

a semiconductor substrate;

a first gate electrode structure having first stacked layers formed on a first insulating film deposited on a surface of said semiconductor substrate in a memory cell area where memory cells are formed; and a second gate electrode structure having second stacked layers formed on a second insulating film deposited on a surface of said semiconductor substrate in a logic circuit area where logic circuits are formed;

wherein a first lowermost layer in said first stacked layers and a second lowermost layer in said second stacked layers comprise different materials, wherein a bottom surface of said second gate electrode structure has a level which is higher than a level of a bottom surface of said first gate electrode structure with the surface of said semiconductor substrate being a reference level, and an upper surface of said first gate electrode is substantially flush with an upper surface of said second gate electrode on the basis of the surface of said semiconductor substrate.

14. The semiconductor device according to claim 13, wherein said first insulating layer is provided directly on the surface of said semiconductor substrate, said second insulating layer is provided on a silicon monocrystalline layer provided on the surface of said semiconductor substrate, and an upper surface of said polycrystalline silicon layer and an upper surface of said silicon monocrystalline layer are flush with each other, an upper surface of said second insulating layer and an upper surface of said third insulating layer are at substantially a same level, and an upper surface of a first polycrystalline silicon germanium layer provided so as to contact with said second lowermost layer in the second stacked layers and an upper surface of a second polycrystalline silicon germanium layer provided on said polycrystalline silicon layer through a third insulating layer in the first electrode structure are flush with each other, respectively, on the basis of the surface of said semiconductor substrate.

* * * * *